(12) United States Patent
Noro

(10) Patent No.: US 8,198,382 B2
(45) Date of Patent: Jun. 12, 2012

(54) EPOXY RESIN COMPOSITION FOR PHOTOSEMICONDUCTOR ELEMENT ENCAPSULATION AND CURED PRODUCT THEREOF, AND PHOTOSEMICONDUCTOR DEVICE USING THE SAME

(75) Inventor: Hiroshi Noro, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 271 days.

(21) Appl. No.: 12/600,324

(22) PCT Filed: Apr. 16, 2008

(86) PCT No.: PCT/JP2008/057453
§ 371 (c)(1),
(2), (4) Date: Nov. 16, 2009

(87) PCT Pub. No.: WO2008/142931
PCT Pub. Date: Nov. 27, 2008

(65) Prior Publication Data
US 2010/0164127 A1    Jul. 1, 2010

(30) Foreign Application Priority Data

May 17, 2007 (JP) .................. 2007-131991

(51) Int. Cl.
C08L 63/00 (2006.01)
C08L 63/06 (2006.01)
H01L 23/29 (2006.01)
(52) U.S. Cl. .............. 525/533; 257/793; 525/508
(58) Field of Classification Search ............... None
See application file for complete search history.

(56) References Cited

U.S. PATENT DOCUMENTS

| 6,617,400 | B2 * | 9/2003 | Yeager et al. | 525/533 |
| 2003/0132701 | A1 * | 7/2003 | Sato et al. | 313/503 |
| 2004/0063840 | A1 * | 4/2004 | Starkey | 524/442 |

FOREIGN PATENT DOCUMENTS

| DE | 3626318 A1 * | 3/1987 |
| JP | 7-238145 A * | 9/1995 |
| JP | 7-309927 A | 11/1995 |
| JP | 8-73705 A * | 3/1996 |
| JP | 2003-224305 A | 8/2003 |
| JP | 2004-528472 A | 9/2004 |
| JP | 2005-068234 A | 3/2005 |
| JP | 2006-213848 A | 8/2006 |
| JP | 2007-169337 A | 7/2007 |
| JP | 2008-56848 A | 3/2008 |

OTHER PUBLICATIONS

International Search Report (PCT/ISA/210) issued for PCT/JP2008/057453, dated Jun. 24, 2008.
Communication, dated Feb. 17, 2012, issued by the Korean Intellectual Property Office in Korean Application No. 10-2009-7023909.

* cited by examiner

*Primary Examiner* — Robert Sellers
(74) *Attorney, Agent, or Firm* — Sughrue Mion, PLLC

(57) ABSTRACT

The present invention relates to an epoxy resin composition for photosemiconductor element encapsulation, the epoxy resin composition including the following components (A) to (D): (A) an epoxy resin having two or more epoxy groups in one molecule thereof, (B) an acid anhydride curing agent, (C) a curing accelerator, and (D) an alcohol compound having three or more primary hydroxyl groups in one molecule thereof.

6 Claims, No Drawings

EPOXY RESIN COMPOSITION FOR PHOTOSEMICONDUCTOR ELEMENT ENCAPSULATION AND CURED PRODUCT THEREOF, AND PHOTOSEMICONDUCTOR DEVICE USING THE SAME

TECHNICAL FIELD

The present invention relates to an epoxy resin composition for photosemiconductor element encapsulation to be used for encapsulating a photosemiconductor element and a cured product thereof, and a photosemiconductor device encapsulated with a resin using the same.

BACKGROUND ART

As an encapsulating material for encapsulating photosemiconductor elements such as light emitting elements and light receiving sensors, a cured product of the material is generally required to have transparency, so that an epoxy resin composition obtained by using an epoxy resin such as a bisphenol A-type epoxy resin or an alicyclic epoxy resin and a curing agent such as an acid anhydride has been commonly used.

However, in recent years, luminance has been heightened in light emitting elements and use of light receiving sensors has become popularized in in-vehicle applications and as blu-ray pickups. Under the circumstances, as the epoxy resin composition for photosemiconductor element encapsulation, a transparent encapsulating material having a higher heat resistance and light resistance as before has been required.

For example, in the above epoxy resin composition for photosemiconductor element encapsulation, as a method for improving heat resistance or light resistance, there have been hitherto used: a method for elevating glass transition temperature (Tg) of a cured product thereof by using a polyfunctional epoxy resin (see Patent Document 1); and a method for suppressing light deterioration by light absorption by using an alicyclic epoxy resin (see Patent Document 2).

Patent Document 1: JP-A-2005-68234
Patent Document 2: JP-A-7-309927

DISCLOSURE OF THE INVENTION

However, in general, in the case where a polyfunctional epoxy resin or an alicyclic epoxy resin is used for the purpose of improving light resistance and heat resistance as above, decrease in strength as an encapsulating resin is caused, so that there is a concern that a problem of resin crack formation owing to heat shrinkage may arise at the time when a photosemiconductor element is encapsulated with such an epoxy resin composition and molded.

The invention has been devised in consideration of such a situation and an object thereof is to provide an epoxy resin composition for photosemiconductor element encapsulation, which is excellent in heat resistance and light resistance and excellent in suppressing effect on crack formation of the encapsulating resin, and a cured product thereof, as well as a highly reliable photosemiconductor device using the same.

The present inventors have intensively investigated in order to obtain a suppressing effect on crack formation resulting from insufficient strength of the conventional epoxy resin composition using a polyfunctional epoxy resin or an epoxy resin having an alicyclic structure, which has characteristics of light resistance and heat resistance. As a result, they have found that not only light resistance and heat resistance but also excellent crack resistance of suppressing the resin crack formation are attained when an alcohol compound having three or more primary hydroxyl groups in one molecule thereof is used as a modifier. Namely, by using the above alcohol compound to be a modifier, derived from the skeleton structure, an action to impart flexibility to a resin matrix having a crosslinked structure to improve mechanical strength (toughness) is exhibited through the incorporation into a cured product of the epoxy resin composition, so that it has been found that an improvement of crack resistance is realized. Thus, they have reached the invention.

Namely, the present invention relates to the following items 1 to 7.
1. An epoxy resin composition for photosemiconductor element encapsulation, the epoxy resin composition including the following components (A) to (D):
   (A) an epoxy resin having two or more epoxy groups in one molecule thereof,
   (B) an acid anhydride curing agent,
   (C) a curing accelerator, and
   (D) an alcohol compound having three or more primary hydroxyl groups in one molecule thereof.
2. The epoxy resin composition for photosemiconductor element encapsulation according to item 1, in which the curing accelerator is an organic acid salt of an organic amine compound.
3. The epoxy resin composition for photosemiconductor element encapsulation according to item 1 or 2, in which a content of the curing accelerator is from 0.01 to 8.0 parts by weight based on 100 parts by weight of the epoxy resin.
4. The epoxy resin composition for photosemiconductor element encapsulation according to any one of items 1 to 3, in which the alcohol compound is trimethylolpropane, trimethyloloctane, trihydroxyethyl isocyanurate, or any of compounds represented by the following structural formulae (1) to (3):

[Chem. 1]

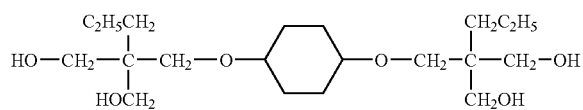

(1)

[Chem. 2]

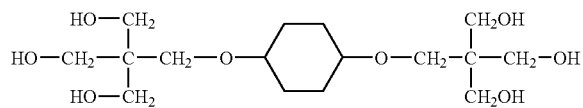

(2)

[Chem. 3]

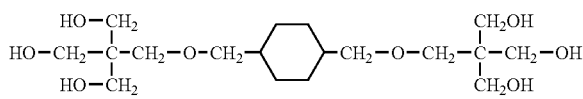

(3)

5. The epoxy resin composition for photosemiconductor element encapsulation according to any one of items 1 to 4, in which a content of the alcohol compound is from 0.5 to 15% by weight based on the whole of the epoxy resin composition.
6. A cured product of an epoxy resin composition for photosemiconductor element encapsulation, obtained by curing the epoxy resin composition for photosemiconductor element encapsulation according to any one of items 1 to 5, in which a light transmittance of the cured product having a thickness of 1 mm at a wavelength of 400 nm is 85% or more.

7. A photosemiconductor device including the epoxy resin composition for photosemiconductor element encapsulation according to any one of items 1 to 5 and a photosemiconductor element encapsulated with the epoxy resin composition.

As above, the invention relates to an epoxy resin composition for photosemiconductor element encapsulation containing the above alcohol compound "component (D)". Therefore, since the alcohol compound is compatible in the system, reduction in inner stress is realized in the resulting cured product without inviting decrease in light transmittance and also an excellent light-deterioration resistance particularly against short wavelength is exhibited, so that deterioration of a photosemiconductor device can be effectively prevented. Accordingly, the photosemiconductor device encapsulated with the epoxy resin composition for photosemiconductor element encapsulation of the invention is excellent in reliability and can fully exhibit functions thereof.

Furthermore, when an organic acid salt of an organic amine compound is used as a curing accelerator, the composition becomes excellent in latency in accelerating cure and also becomes excellent in storage stability (preservation stability).

Thus, the cured product formed by using the epoxy resin composition for photosemiconductor element encapsulation of the invention possesses a high transparency. For example, in the case of forming it into a plate having a thickness of 1 mm, light transmittance thereof at a wavelength of 400 nm is 85% or more.

BEST MODE FOR CARRYING OUT THE INVENTION

The epoxy resin composition for photosemiconductor element encapsulation of the invention is obtained by using an epoxy resin (component A), an acid anhydride curing agent (component B), a curing accelerator (component C), and a particular alcohol compound (component D).

The above epoxy resin (component A) is not particularly limited as long as it has two or more epoxy groups in one molecule thereof Examples thereof include respective hydrogenated epoxy resins of conventionally used epoxy resins, such as hydrogenated bisphenol A-type epoxy resin, hydrogenated bisphenol F-type epoxy resin, and hydrogenated naphthalene-type epoxy resin; alicyclic epoxy resins; and nitrogen-containing epoxy resins such as triglycidyl isocyanurate and hydantoin epoxy resins. They may be used alone or may be used in combination with a conventionally used bisphenol A-type epoxy resin, bisphenol F-type epoxy resin, biphenyl-type epoxy resin, phenol novolak-type epoxy resin, or the like. Of these epoxy resins, from the viewpoints of transparency and discoloration resistance of the cured product, it is preferred to use an alicyclic epoxy resin and triglycidyl isocyanurate alone or in combination thereof.

Such an epoxy resin (component A) may be solid or liquid at ordinary temperature and, in general, an average epoxy equivalent of the epoxy resin to be used is preferably from 90 to 1000. In the case of solid one, the softening point is preferably 160° C. or lower. When the epoxy equivalent is less than 90, the cured product of the epoxy resin composition for photosemiconductor element encapsulation sometimes becomes brittle. When the epoxy equivalent exceeds 1000, the glass transition temperature (Tg) of the cured product becomes low in some cases.

As the acid anhydride curing agent (component B) to be used together with the above epoxy resin (component A), there may be, for example, mentioned phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, and methyltetrahydrophthalic anhydride. They may be used alone or may be used in combination thereof. Of these acid anhydride curing agents, it is preferred to use phthalic anhydride, hexahydrophthalic anhydride, tetrahydrophthalic anhydride, or methylhexahydrophthalic anhydride. As the above acid anhydride curing agent, one having a molecular weight of around 140 to 200 is preferred and also a colorless or pale yellow acid anhydride is preferred.

The mixing ratio of the above epoxy resin (component A) to the acid anhydride curing agent (component B) is preferably set to a ratio so that an active group (an acid anhydride group, including a hydroxyl group in the case where a phenol resin is used in combination) reactive with an epoxy group in the acid anhydride curing agent (component B) becomes from 0.5 to 1.5 equivalents, more preferably from 0.7 to 1.2 equivalents with respect to 1 equivalent of the epoxy resin in the above epoxy resin (component A). When the ratio of the active group is less than the above lower limit, there is a tendency that the curing rate of the epoxy resin composition for photosemiconductor element encapsulation decreases and also the glass transition temperature (Tg) of the cured product becomes low. When the ratio exceeds the above upper limit, there is a tendency that moisture resistance decreases.

Moreover, as the acid anhydride curing agent (component B), depending on the purposes and applications, other than the above acid anhydride curing agent, a conventionally known curing agent for epoxy resins, for example, a phenol resin curing agent, an amine curing agent, one obtained by partial esterification of the above acid anhydride curing agent with an alcohol, or a curing agent of a carboxylic acid such as hexahydrophthalic acid, tetrahydrophthalic acid, or methylhexahydrophthalic acid may be used in combination with the acid anhydride curing agent. For example, in the case where the curing agent of a carboxylic acid is used in combination, the curing rate can be accelerated and thus productivity can be improved. Even in the case of using these curing agents, the mixing ratio may be determined according to the mixing ratio (equivalent ratio) in the case of using the above acid anhydride curing agent (component B).

As the curing accelerator (component C) to be used together with the above components A and B, there may be, for example, mentioned tertiary amines such as 1,8-diazabicyclo[5.4.0]undecene-7, triethylenediamine, and tri-2,4,6-dimethylaminomethylphenol; imdazoles such as 2-ethyl-4-methylimidazole and 2-methylimidazole; phosphorous compounds such as triphenylphosphine, tetraphenylphosphonium tetraphenylborate, and tetra-n-butylphosphonium-o,o-diethylphosphorodithioate; quaternary ammonium salts; organometallic salts; and derivatives thereof. They may be used alone or may be used in combination of thereof. Of these curing accelerators, from the viewpoints of latency in accelerating cure and curing properties, an organic acid salt of an organic amine compound is preferably used and an octylic acid salt or sulfonium salt of a tertiary amine such as 1,8-diazabicyclo[5.4.0]undecene-7 is more preferably used.

The content of the above curing accelerator (component C) is preferably set to from 0.01 to 8.0 parts by weight (hereinafter abbreviated as "part(s)"), more preferably from 0.1 to 3.0 parts by weight based on 100 parts by weight of the above epoxy resin (component A). When the content of the curing accelerator (component C) is less than the lower limit, it is difficult to obtain a sufficient curing accelerating effect. Moreover, when the content exceeds the upper limit, the resulting cured product is discolored in some cases.

The particular alcohol compound (component D) to be used together with the above components A to C shows an action as a modifier for the epoxy resin composition and is an alcohol compound having three or more primary hydroxyl groups in one molecule thereof. Specifically, compounds having a form of —CH$_2$OH may be mentioned. Examples thereof include trimethylolpropane, trimethyloloctane, pentaerythritol, dipentaerythritol, trimethanolamine, triethanolamine, trihydroxyethyl isocyanurate, and respective compounds represented by the following structural formulae (1) to (4). They may be used alone or in combination of thereof.

[Chem. 4]

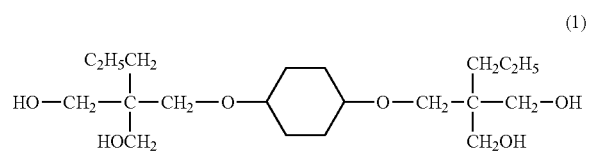

(1)

[Chem. 5]

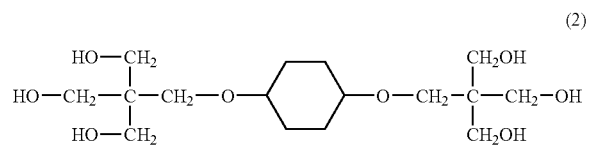

(2)

[Chem. 6]

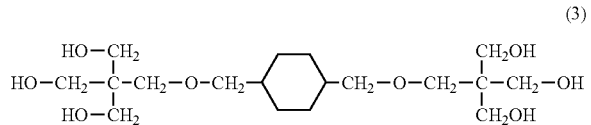

(3)

[Chem. 7]

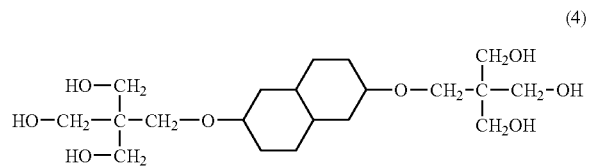

(4)

Of the above compounds, from the viewpoints of compatibility and solubility with the resin component, trimethylolpropane, trimethyloloctane, trihydroxyethyl isocyanurate, and respective compounds represented by the following structural formulae (1) to (3) are more preferably used.

The content of the above particular alcohol compound (component D) is preferably set to the range of 0.5 to 15% by weight based on the whole epoxy resin composition. Particularly preferred is the range of 1 to 10% by weight. When the content of the component D is less than the lower limit, there is observed a tendency that flexibility cannot sufficiently be imparted to the cured product. When the content of the component D exceeds the upper limit, the glass transition temperature of the cured product lowers and a tendency of decrease in heat resistance is observed.

Furthermore, the epoxy resin composition for photosemiconductor element encapsulation of the invention may suitably contain, in addition to the above components A to D, various known additives such as a deterioration inhibitor, a modifier other than the above component D, a silane coupling agent, a defoaming agent, a leveling agent, a releasing agent, a dye, a pigment, and the like, if necessary.

Moreover, in the case where the photosemiconductor device in the invention is a light emitting device which emits a light having a wavelength of from ultraviolet region to blue, it is possible to convert the device into a device emitting a white light by dispersing a fluorescent material as a wavelength converting material in the epoxy resin composition or by disposing the fluorescent material around the light emitting element.

As the deterioration inhibitor, there may be, for example, mentioned conventionally known deterioration inhibitors such as phenol compounds, amine compounds, organic sulfur compounds, and phosphine compounds. As the silane coupling agent, there may be, for example, mentioned conventionally known silane coupling agents such as silanes and titanates. As the defoaming agent, there may be, for example, mentioned conventionally known defoaming agents such as silicones.

The epoxy resin composition for photosemiconductor element encapsulation of the invention can be obtained in the form of liquid, powder or a tablet formed through tabletting from the powder, by preparing the composition in the following manner, for example. That is, in order to obtain a liquid epoxy resin composition for photosemiconductor element encapsulation, for example, the above-described components, i.e., the epoxy resin (component A), the acid anhydride curing agent (component B), the curing accelerator (component C), and the particular alcohol compound (component D), as well as various additives to be blended as needed, may be appropriately blended. Moreover, in order to obtain the epoxy resin composition in the form of powder or a tablet formed through tabletting from the powder, the epoxy resin composition can be prepared by, for example, appropriately blending the above-described components, preliminarily mixing the components, then kneading and melt mixing the resulting mixture using a kneading machine, subsequently cooling the resulting mixture to room temperature, and then pulverizing the cooled product by a known methods after being subjected to an aging process, followed by tabletting the pulverization product, if necessary.

The epoxy resin composition for photosemiconductor element encapsulation of the invention thus obtained is used as a material for encapsulating photosemiconductor elements such as light emitting diodes (LED), charge-coupled devices (CCD), and the like. That is, encapsulation of a photosemiconductor element using the epoxy resin composition for photosemiconductor element encapsulation of the invention is not particularly limited in the method, and may be carried out by a known molding method such as conventional transfer molding, casting, or the like. When the epoxy resin composition for photosemiconductor element encapsulation of the invention is liquid, the epoxy resin composition may be used as the so-called two-liquid type such that at least the epoxy resin component and the curing agent component are stored separately and mixed immediately before use. When the epoxy resin composition for photosemiconductor element encapsulation of the invention is in the form of powder or tablet after being subjected to a predetermined aging process, the above-mentioned components are provided in the state of B stage (semi-cured state) upon melting and mixing of the components, and this product may be heated and melted upon use.

The cured product obtained by using the epoxy resin composition for photosemiconductor element encapsulation of the invention has a light transmittance of 85% or more at the wavelength of 400 nm at a thickness of 1 mm. In this connection, the light transmittance can be, for example, measured at room temperature by using a spectrophotometer. In the invention, room temperature means the range of 5 to 35° C.

Next, the invention will be described with reference to Examples and Comparative Examples. However, the invention is not limited to these Examples.

EXAMPLES

First, the following components were prepared prior to Examples.

Epoxy Resin a:
Triglycidyl isocyanurate (epoxy equivalent 100 g/eq., softening point 100° C.)

Epoxy Resin b: 1,2-Epoxy-4-(2-oxiranyl)cyclohexane adduct of 2,2-bis(hydroxymethyl)-1- butanol (epoxy equivalent 185 g/eq., softening point 85° C.)

Acid Anhydride Curing Agent:
Methylhexahydrophthalic anhydride (acid equivalent 168 g/eq.)

Curing Accelerator:
Octylic acid salt of 1,8-diazabicyclo[5.4.0]undecene-7

Modifier a:
Trimethylolpropane

Modifier b:
Trihydroxyethyl isocyanurate

Modifier c:
1,4-Bis[3-hydroxy-2,2-di(hydroxymethyl)propyloxy]-cyclohexane

Modifier d:
Ethylene glycol

Examples 1 to 7 and Comparative Examples 1 to 4

After the respective components indicated in the following Table 1 and Table 2 were preliminary mixed at the ratios indicated in the tables, the mixtures were kneaded and melt mixed using a kneader, and after the products were cooled to room temperature, epoxy resin compositions were prepared by pulverization.

Using each of the epoxy resin compositions thus obtained, glass transition temperature, light transmittance, and an incidence of crack of the photosemiconductor device were measured and evaluated according to the following methods, respectively. These results are shown in the following Tables 1 and 2.

Glass Transition Temperature

Each of the above epoxy resin compositions was used to produce a specimen (size: 20 mm×5 mm×thickness 5 mm) (curing condition: 150° C.×3 hr). Using from 10 to 20 mg of the specimen (cured product), the glass transition temperature was measured by a differential scanning calorimeter (manufactured by Perkin-Elmer, PYRIS1) under a condition of a temperature-elevating rate of 10° C/min.

Light Transmittance

Each of the above epoxy resin compositions was used to produce a specimen (size: 50 mm ⌀×thickness 1 mm) (curing condition: 150° C×3 hr). Using the specimen (cured product), the light transmittance was measured while the specimen was immersed in liquid paraffin. As a measuring apparatus, a spectrophotometer UV3101 manufactured by Shimadzu Corporation was used and the light transmittance at a wavelength of 400 nm at room temperature (25° C.) was measured.

Incidence of Crack

Each of the above epoxy resin compositions was used to produce a photosemiconductor device (printed board: material=FR-4, thickness=0.3 mm, size=48×48 mm, dummy chip: material=silicon, thickness=0.3 mm, size=1.5×1.5 mm, number of mounted chips=16 pieces/printed board, thickness of encapsulating resin layer=0.8 mm) through molding and encapsulation by means of TMM-300 manufactured by Takara Inc. under conditions of 150° C.×3 minutes×9.8 MPa. Then, the number of formed cracks at the encapsulating resin portion after cooling was counted and was calculated as an incidence to the number of the total chip units.

TABLE 1

| | | | | | Example | | | | (Part) |
|---|---|---|---|---|---|---|---|---|---|
| | | 1 | 2 | 3 | 4 | 5 | 6 | 7 |
| Epoxy resin | a | 100 | — | 100 | 100 | 100 | 100 | — |
| | b | — | 100 | — | — | — | — | 100 |
| Acid anhydride curing agent | | 168 | 91 | 168 | 168 | 168 | 91 | 91 |
| Curing accelerator | | 4 | 4 | 4 | 4 | 4 | 4 | 4 |
| Modifier | a | 21 | 10 | — | — | 21 | 12 | 5 |
| | b | — | — | 24 | — | — | — | — |
| | c | — | — | — | 16 | — | — | — |
| | d | — | — | — | — | — | — | — |
| Glass transition temperature (Tg) (° C.) | | 163 | 154 | 178 | 168 | 165 | 174 | 168 |
| Light transmittance (%) | | 91 | 88 | 89 | 91 | 92 | 94 | 90 |
| Incidence of crack (%) | | 0 | 0 | 0 | 0 | 0 | 0 | 0 |

TABLE 2

| | | Comparative Example | | | | (part) |
|---|---|---|---|---|---|---|
| | | 1 | 2 | 3 | 4 |
| Epoxy resin | a | 100 | 100 | — | 100 |
| | b | — | — | 100 | — |
| Acid anhydride curing agent | | 168 | 168 | 91 | 168 |
| Curing accelerator | | 4 | 4 | 4 | 4 |
| Modifier | a | — | — | — | — |
| | b | — | — | — | — |
| | c | — | — | — | — |
| | d | — | 11 | 6 | 15 |
| Glass transition temperature (Tg) (° C.) | | 203 | 153 | 149 | 139 |
| Light transmittance (%) | | 94 | 90 | 89 | 76 |
| Incidence of crack (%) | | 63 | 13 | 75 | 44 |

From the above results, the products of Examples obtained by blending one of the modifiers which are compounds each having three or more primary hydroxyl groups in one molecule thereof, which is a characteristic of the invention, had a high glass transition temperature (Tg) of the cured products, all showed high numerical values of 88% or more also in light transmittance, and no cracks formed.

On the other hand, the product of Comparative Example 1 in which no modifier was blended showed a high glass transition temperature (Tg) and a high light transmittance but the incidence of crack was very high, i.e., 63%. Moreover, the products of Comparative Examples 2 to 4 showed at least either a low glass transition temperature (Tg) or a low light transmittance and also cracks formed. Particularly, there was a product showing a high incidence of crack.

While the invention has been described in detail and with reference to specific embodiments thereof, it will be apparent to one skilled in the art that various changes and modifications can be made therein without departing from the spirit and scope thereof.

The present application is based on Japanese Patent Application No. 2007-131991 filed on May 17, 2007, and the contents are incorporated herein by reference. Also, all the references are incorporated as a whole.

Industrial Applicability

According to the present invention, there can be provided an epoxy resin composition for photosemiconductor element encapsulation, which is excellent in heat resistance and light resistance and excellent in suppressing effect on crack formation of the encapsulating resin.

The invention claimed is:

1. An epoxy resin composition for photosemiconductor element encapsulation, said epoxy resin composition comprising the following components (A) to (D):

(A) an epoxy resin having two or more epoxy groups in one molecule thereof, (B) an acid anhydride curing agent, (C) a curing accelerator, and (D) an alcohol compound having three or more primary hydroxyl groups in one molecule thereof, wherein the alcohol compound is any of compounds represented by the following structural formulae (1) to (3):

[Chem. 1]

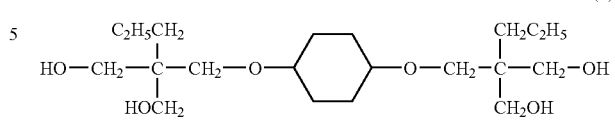

(1)

[Chem. 2]

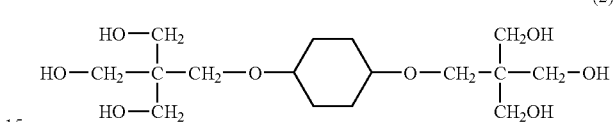

(2)

[Chem. 3]

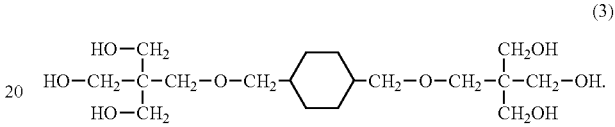

(3)

2. The epoxy resin composition for photosemiconductor element encapsulation according to claim 1, wherein the curing accelerator is an organic acid salt of an organic amine compound.

3. The epoxy resin composition for photosemiconductor element encapsulation according to claim 1, wherein a content of the curing accelerator is from 0.01 to 8.0 parts by weight based on 100 parts by weight of the epoxy resin.

4. The epoxy resin composition for photosemiconductor element encapsulation according to claim 1, wherein a content of the alcohol compound is from 0.5 to 15% by weight based on the whole of the epoxy resin composition.

5. A cured product of an epoxy resin composition for photosemiconductor element encapsulation, obtained by curing the epoxy resin composition for photosemiconductor element encapsulation according to claim 1, wherein a light transmittance of the cured product having a thickness of 1 mm at a wavelength of 400 nm is 85% or more.

6. A photosemiconductor device comprising the epoxy resin composition for photosemiconductor element encapsulation according to claim 1 and a photosemiconductor element encapsulated with the epoxy resin composition.

* * * * *